United States Patent [19]
Petruchik

[11] Patent Number: 6,075,948
[45] Date of Patent: Jun. 13, 2000

[54] ELECTRONIC FLASH APPARATUS

[75] Inventor: Dwight J. Petruchik, Honeoye Falls, N.Y.

[73] Assignee: Eastman Kodak Company, Rochester, N.Y.

[21] Appl. No.: 09/226,327

[22] Filed: Jan. 6, 1999

[51] Int. Cl.[7] .................................................. G03B 15/05
[52] U.S. Cl. ........................... 396/176; 396/180; 396/200
[58] Field of Search ................................ 396/180, 6, 200, 396/155, 176; 362/3, 8, 16

[56] References Cited

U.S. PATENT DOCUMENTS

| | | |
|---|---|---|
| 4,223,372 | 9/1980 | Takematsu ................................ 362/8 |
| 5,047,900 | 9/1991 | DiRisio ..................................... 362/16 |
| 5,436,685 | 7/1995 | Yamashina .......................... 396/176 X |
| 5,541,687 | 7/1996 | Pearson .................................. 396/176 |
| 5,565,943 | 10/1996 | Muramatsu et al. ................ 396/176 X |
| 5,651,601 | 7/1997 | Morisawa ................................. 362/16 |
| 5,708,876 | 1/1998 | Allen et al. ............................. 396/176 |
| 5,913,083 | 6/1999 | Allen ...................................... 396/176 |

*Primary Examiner*—W. B. Perkey
*Attorney, Agent, or Firm*—Roger A. Fields

[57] ABSTRACT

A flash circuit board has a resilient integral portion that urges a flash reflector against a flash tube and urges a triggering electrode against the flash reflector in order to enable the flash tube to be fired. Also, the resilient integral portion of the flash circuit board urges the flash reflector against a flash cover-lens in order to properly seat the flash reflector relative to the flash cover-lens.

13 Claims, 8 Drawing Sheets

ELECTRONIC FLASH APPARATUS

FIELD OF THE INVENTION

The invention relates generally to the field of photography, and in particular to an electronic flash apparatus for a camera. More specifically, the invention relates to a flash circuit board having a resilient integral portion that urges a flash reflector against a flash tube and urges a triggering electrode against the flash reflector in order to enable the flash tube to be fired. Also, the resilient integral portion of the flash circuit board urges the flash reflector against a flash cover-lens in order to properly seat the flash reflector relative to the flash cover-lens.

BACKGROUND OF THE INVENTION

The use of an electronic flash unit for photography is very well known. The main components of an electronic flash unit are a flash circuit board, a through-shaped flash reflector, a flash tube positioned within the flash reflector, and a transparent or translucent flash cover-lens. The flash reflector, the flash tube and the flash cover-lens are mounted on the flash circuit board. The flash reflector is shaped to concentrate the flash light produced by the flash tube and to direct the flash light through a front open end of the reflector towards the subject to be illuminated. The most efficient shape of the reflector is a parabola which concentrates the flash light into a beam that may have parallel, converging or diverging rays according to whether the flash tube is at the focal point of the parabola, in front of the focal point, or behind the focal point. The flash cover-lens covers the front open end of the flash reflector and can act as a light diffuser, softening the flash light and spreading it more evenly over the subject to be illuminated.

The flash tube is filled with an ionizable gas, and it has an in-line pair of anode and cathode main electrodes at its opposite ends which protrude from respective side openings in the flash reflector and are connected to a capacitor on the flash circuit board. The resistance of the gas in the flash tube is normally too high to permit a direct discharge. For firing the flash tube, there is provided a third electrode, i.e. a triggering electrode, for example a triggering wire that is connected to an outer side of a rear closed end of the flash reflector using solder, tape or the like. The flash reflector often is located in a hole or cut-out in the flash circuit board and the rear closed end of the flash reflector protrudes from the hole or cut-out. The flash tube is urged against an inner side of the rear closed end of the flash reflector, such as by an elastomeric band. When the triggering electrode applies a triggering voltage to the flash reflector, the gas in the flash tube is ionized, thus lowering its resistance and allowing the capacitor to discharge its stored energy through the flash tube in the form of a flash of light. See prior art U.S. Pat. No. 4,223,372 issued Sep. 16, 1980, U.S. Pat. No. 5,047,900 issued Sep. 10, 1991, and U.S. Pat. No. 5,436, 685 issued Jul. 25, 1995.

SUMMARY OF THE INVENTION

According to the invention, a flash circuit board has a resilient integral portion that urges a flash reflector against a flash tube and urges a triggering electrode against the flash reflector in order to enable the flash tube to be fired. Also, the resilient integral portion of the flash circuit board urges the flash reflector against a flash cover-lens in order to properly seat the flash reflector relative to the flash cover-lens.

DETAILED DESCRIPTION OF THE INVENTION

Figure 1:
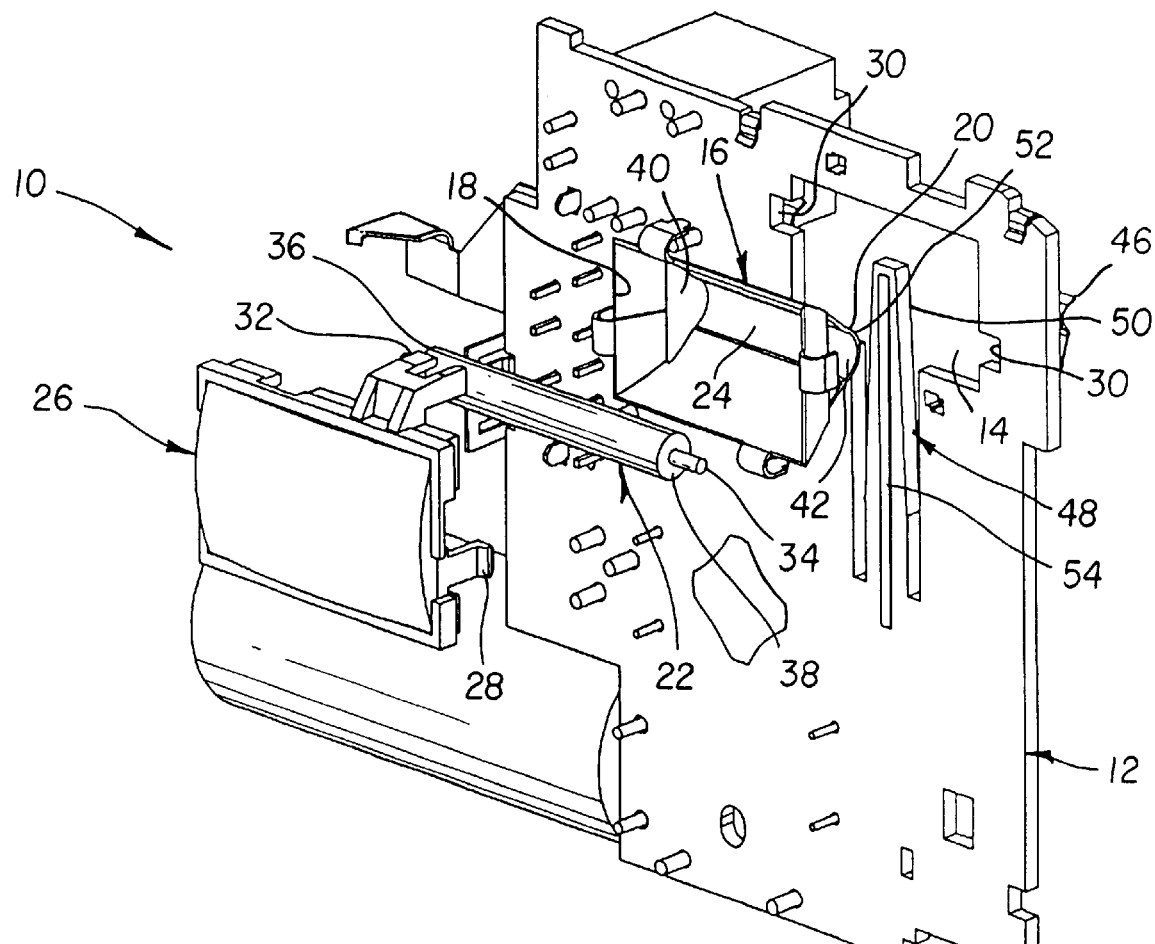
FIG. 1 is an exploded front perspective view of an electronic flash apparatus that is a preferred embodiment of the invention.
Figure 2:
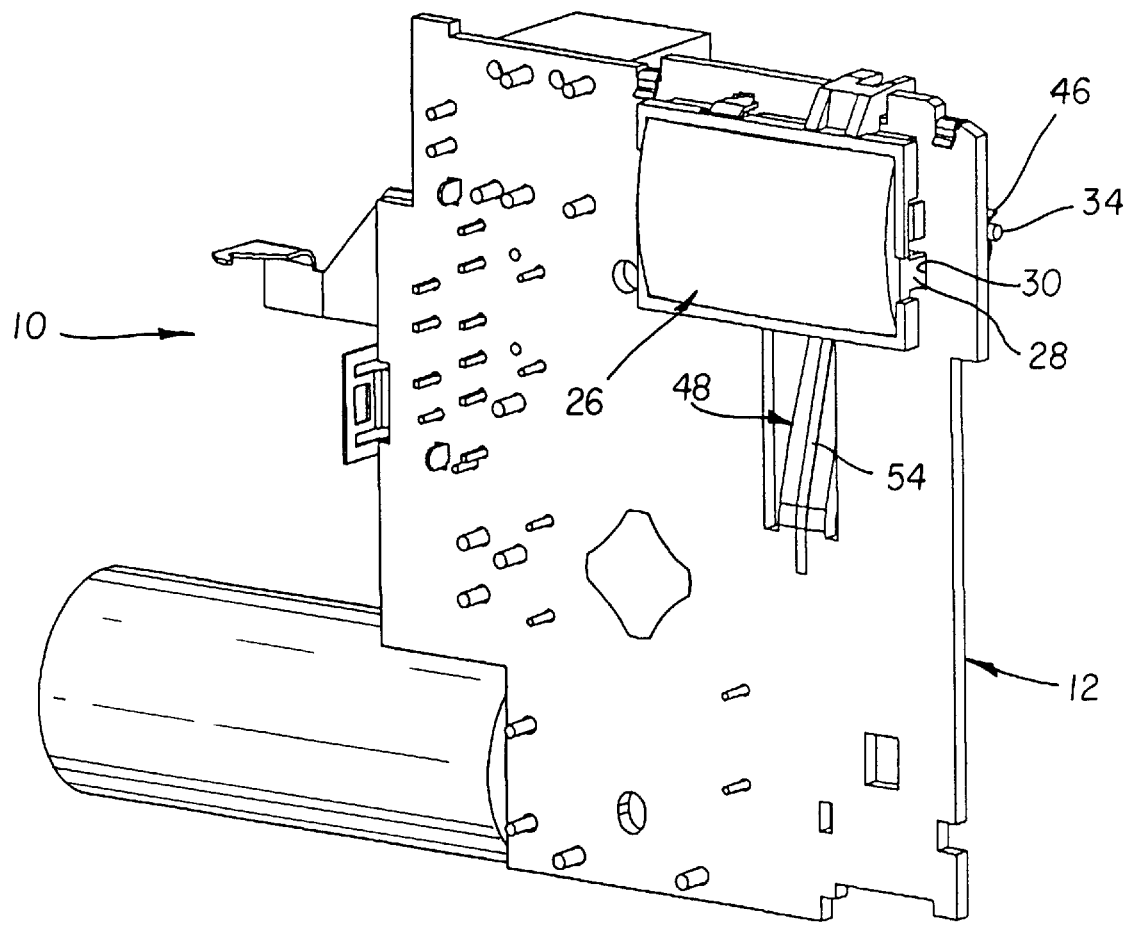
FIG. 2 is an assembled front perspective view of the electronic flash apparatus shown in FIG. 1.

The invention is disclosed as being embodied preferably in an electronic flash unit. Because the features of an electronic flash unit are generally well known, the description which follows is directed in particular only to those elements forming part of or cooperating directly with the disclosed embodiment. It is to be understood, however, that other elements may take various forms known to a person of ordinary skill in the art.

Preferred Embodiment (FIGS. 1–4)

Referring now to the drawings, FIGS. 1–4 show a preferred embodiment of an electronic flash unit 10 comprising a generally flat flash circuit board 12 having a hole or cut-out 14, a through-shaped flash reflector 16 located (partly) in the hole in the flash circuit board and having a rectangular-shaped front open end 18 and a curved rear closed end 20, a flash tube 22 positioned within the flash reflector against a curved inner side 24 of the rear closed end of the flash reflector, and a transparent or translucent flash cover-lens 26 positioned over the front open end of the flash reflector.

The flash cover-lens 26 has two identical posts 28 that are snugly received in corresponding openings 30 in the flash circuit board 12 to affix the flash cover lens directly to the flash circuit board.

Figure 3:
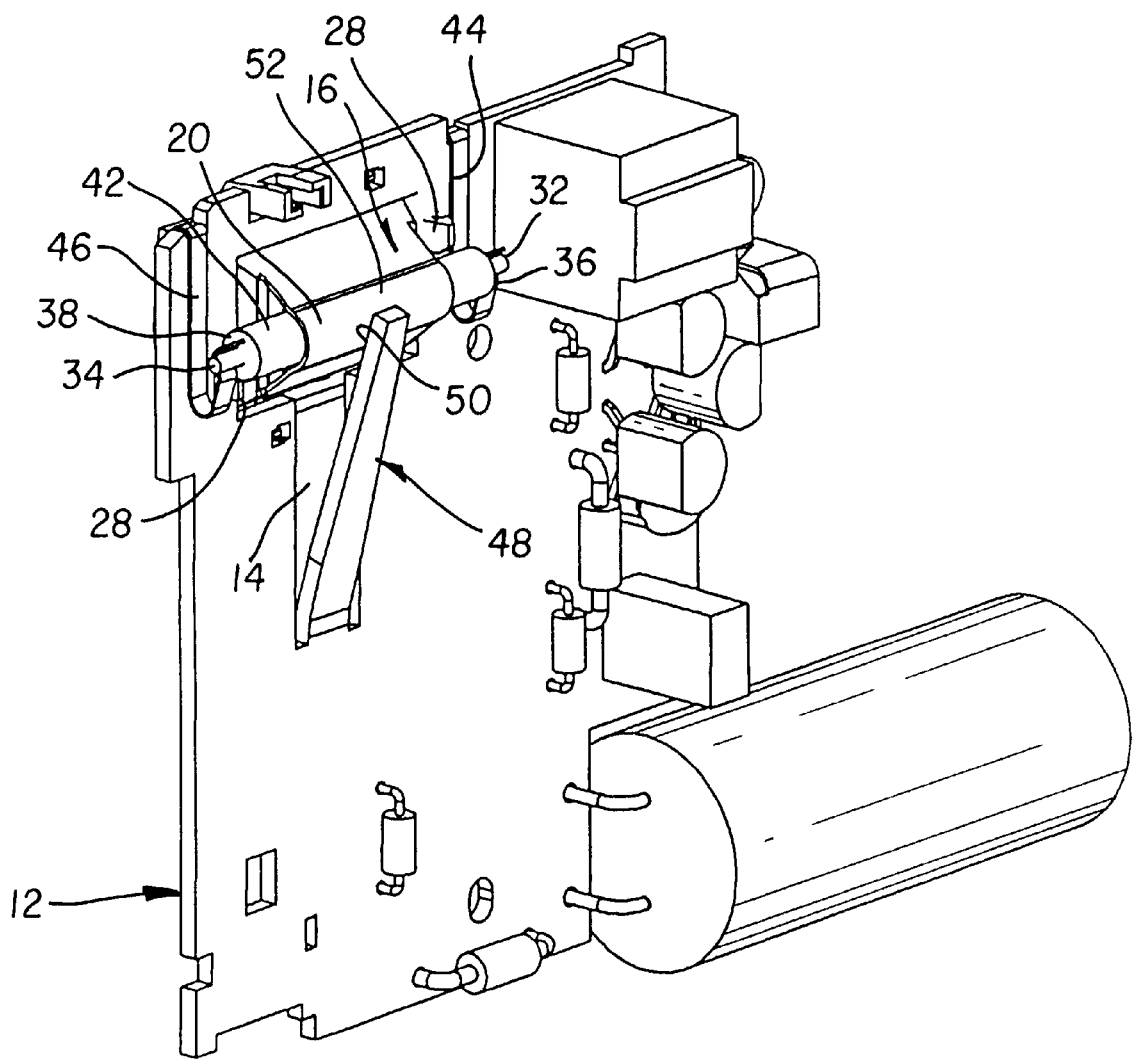
FIG. 3 is an assembled rear perspective view of the electronic flash apparatus shown in FIG. 1.
Figure 4:
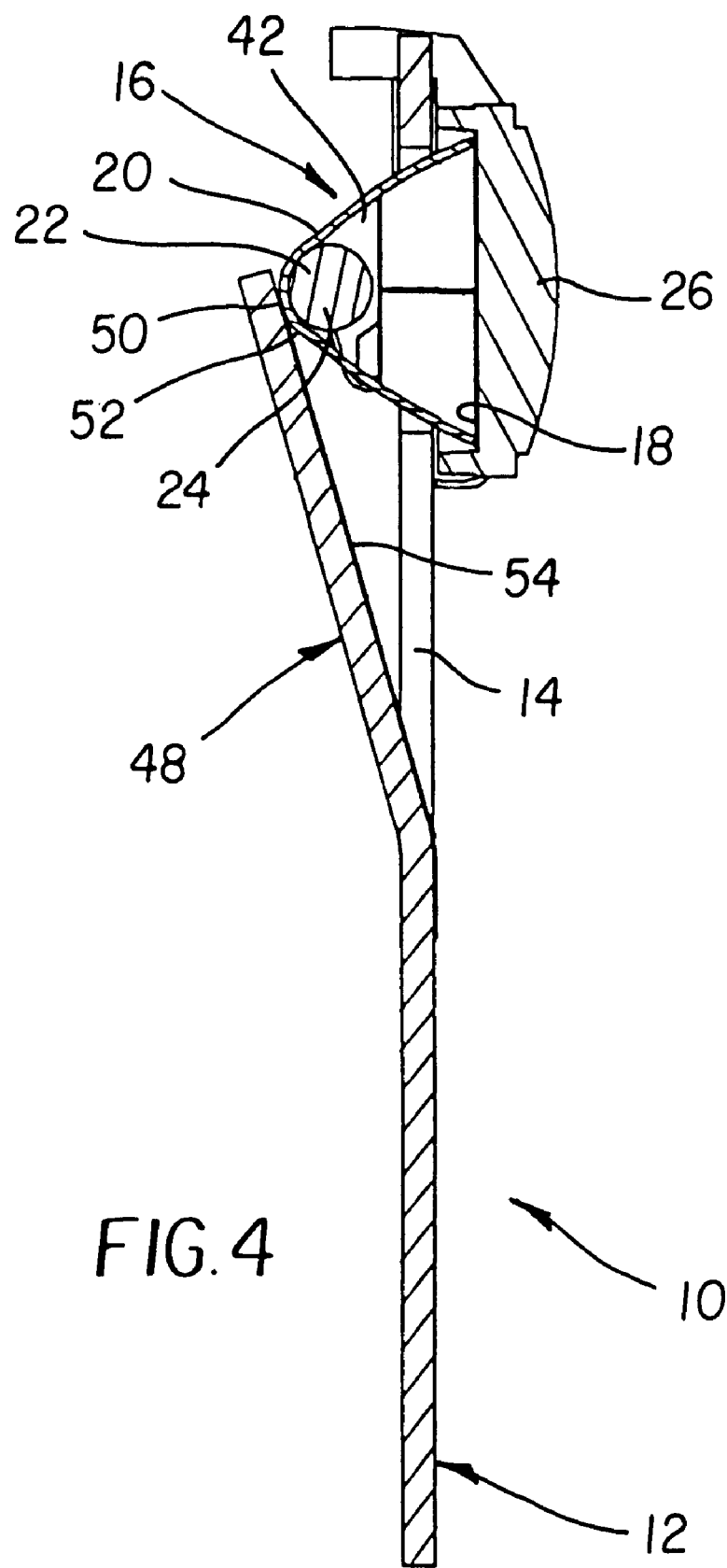
FIG. 4 is an elevation cross-section view of the electronic flash apparatus shown in FIG. 1.
Figure 5:
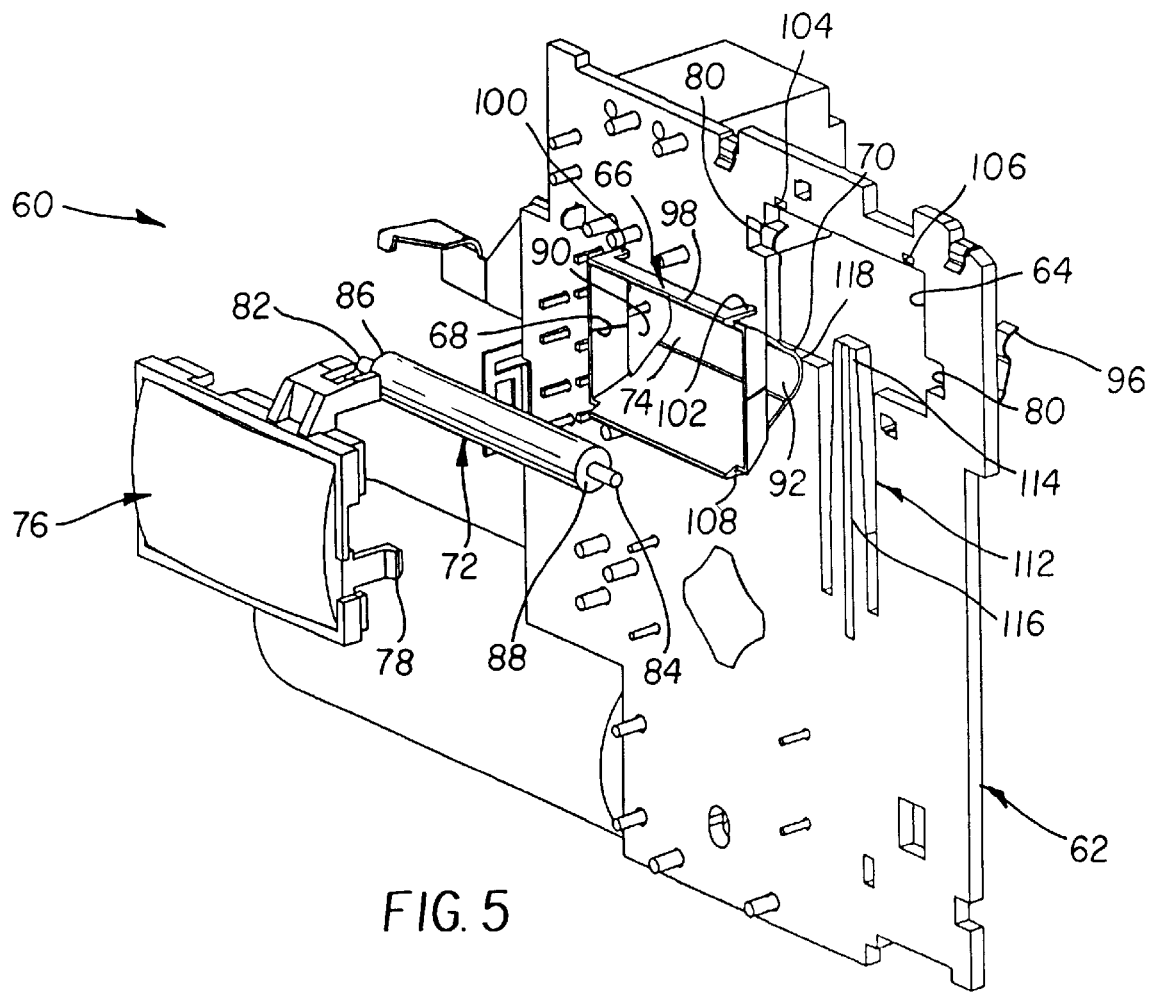
FIG. 5 is an exploded front perspective view of an electronic flash apparatus that is an alternate embodiment of the invention.
Figure 6:
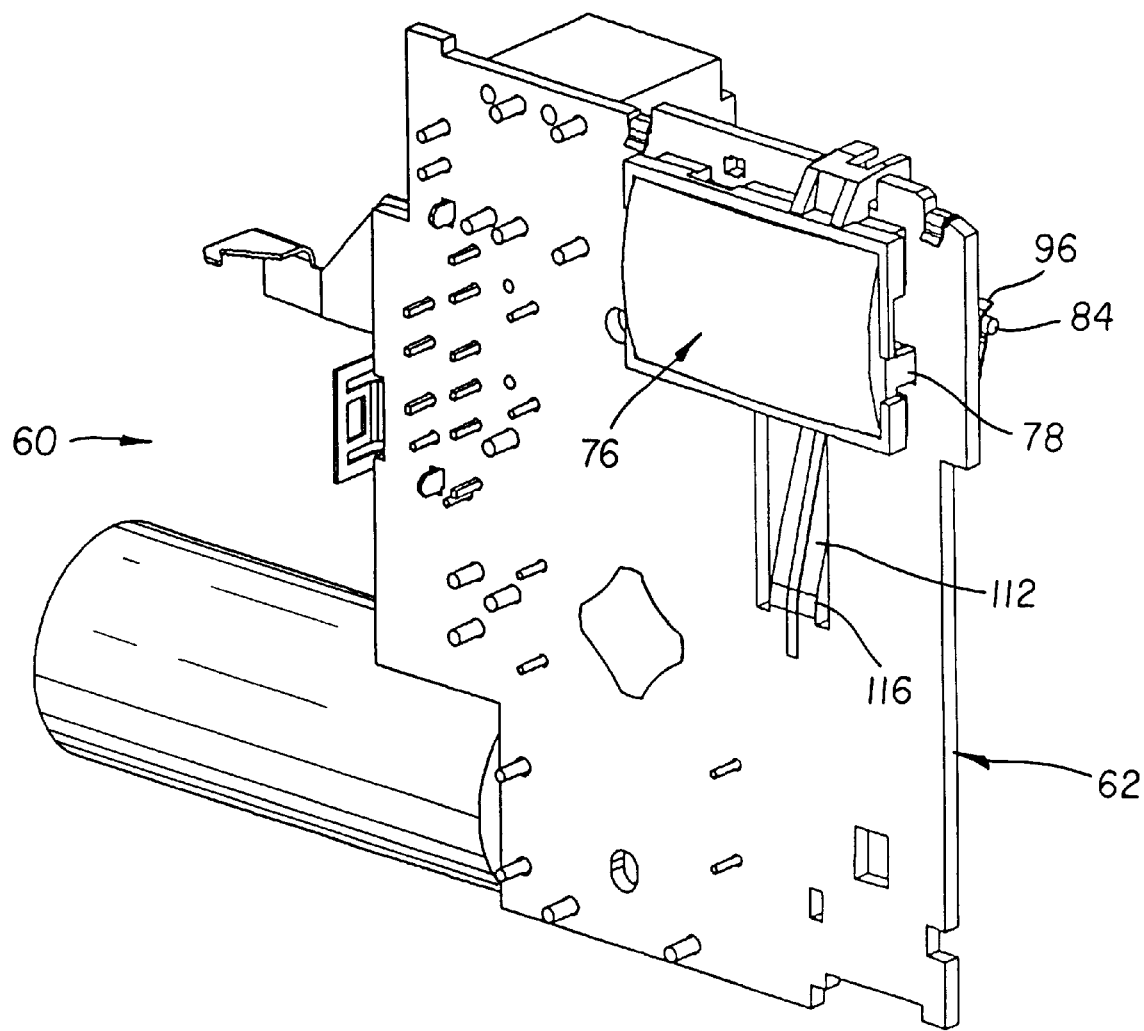
FIG. 6 is an assembled front perspective view of the electronic flash apparatus shown in FIG. 5.

The flash tube 22 has an in-line pair of anode and cathode main electrodes 32 and 34 at its opposite ends 36 and 38 which protrude from respective side openings 40 and 42 in the flash reflector 16. Resilient electrically conductive bands 44 and 46, shown in FIG. 3, are solder-connected to the anode and cathode main electrodes 32 and 34 and to the flash circuit board 12 to interconnect the anode and cathode main electrodes with the flash circuit board, and due to their resilience they support the flash tube 22 for some slight movement.

The flash circuit board 12 has a resilient integral portion preferably in the form of a cantilevered beam 48 that longitudinally extends at an acute angle over the hole 14 in the flash circuit board. A free end 50 of the cantilevered beam 48 inherently presses against an outer side 52 of the rear closed end 20 of the flash reflector 16 to continuously urge the inner side 24 of the rear closed end against the flash tube 22 and to simultaneously urge the front open end 18 of the flash reflector against the flash cover-lens 26.

A flexible triggering electrode 54 is solder-connected to the flash circuit board 12 and is supported on the cantilevered beam 48 of the flash circuit board 12, for the cantilevered beam to hold the triggering electrode against the outer side 52 of the rear closed end 20 of the flash reflector 16.

Urging the inner side 24 of the rear closed end 20 of the flash reflector 16 against the flash tube 22, together with urging the triggering electrode 54 against the outer side 52 of the rear closed end 20 of the flash reflector, enables the flash tube to be fired. Urging the front open end 18 of the flash reflector 16 against the flash cover-lens 26 properly seats the flash reflector relative to the flash cover-lens.

Alternate Embodiment (FIGS. 5–8)

FIGS. 5–8 show an alternate embodiment of an electronic flash unit 60 comprising a generally flat flash circuit board 62 having a hole or cut-out 64, a flash reflector 66 located (partly) in the hole in the flash circuit board and having a rectangular-shaped front open end 68 and a curved rear closed end 70, a flash tube 72 positioned within the flash reflector against a curved inner side 74 of the rear closed end of the flash reflector, and a transparent or translucent flash cover-lens 76 positioned over the front open end of the flash reflector.

The flash cover-lens 76 has two identical posts 78 that are snugly received in corresponding openings 80 in the flash circuit board 62 to affix the flash cover lens directly to the flash circuit board.

The flash tube 72 has an in-line pair of anode and cathode main electrodes 82 and 84 at its opposite ends 86 and 88 which protrude from respective side openings 90 and 92 in the flash reflector 66. Resilient electrically conductive bands 94 and 96, shown in FIG. 7, are solder-connected to the anode and cathode main electrodes 82 and 84 and to the flash circuit board 62 to interconnect the anode and cathode main electrodes with the flash circuit board, and due to their resilience they support the flash tube 72 for some slight movement.

Figure 7:
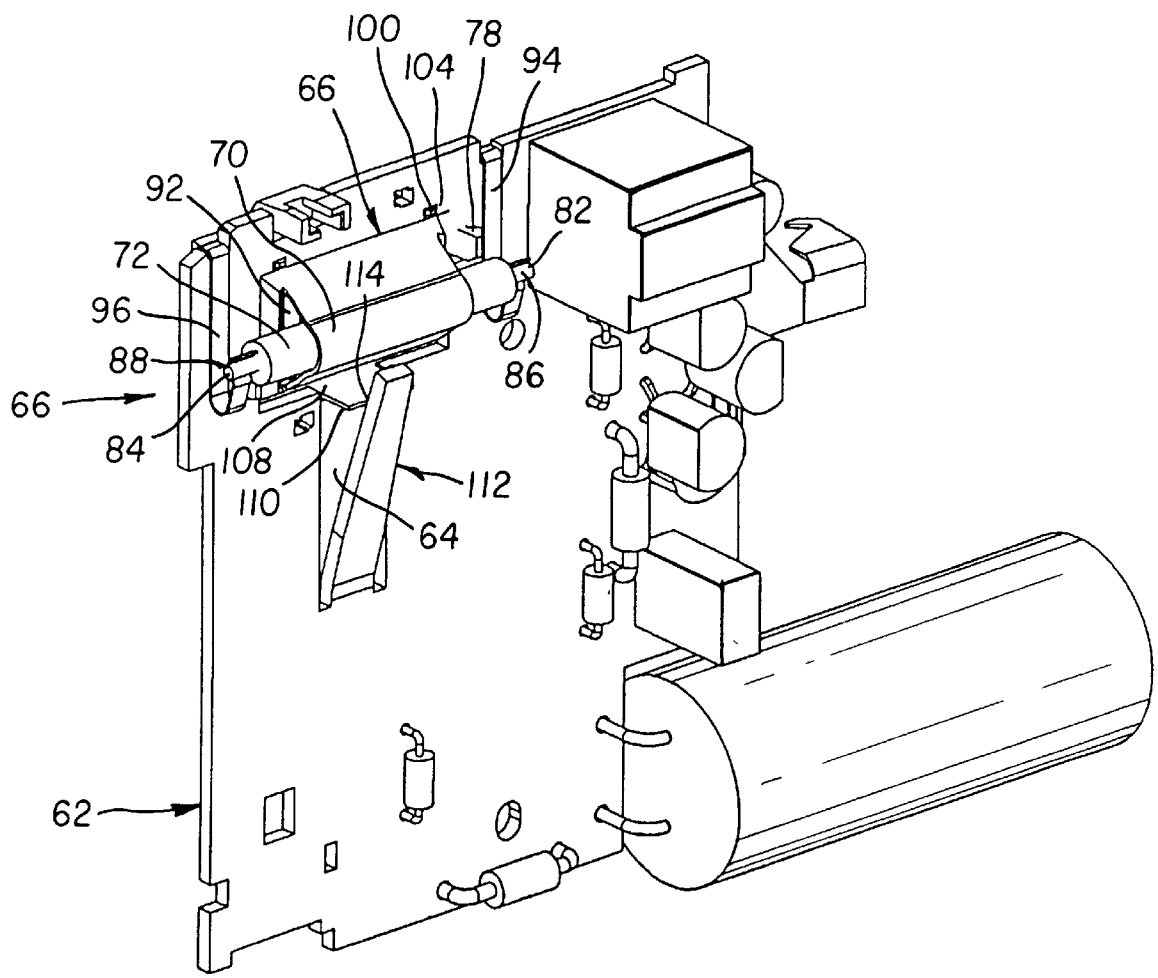
FIG. 7 is an assembled rear perspective view of the electronic flash apparatus shown in FIG. 5.
Figure 8:
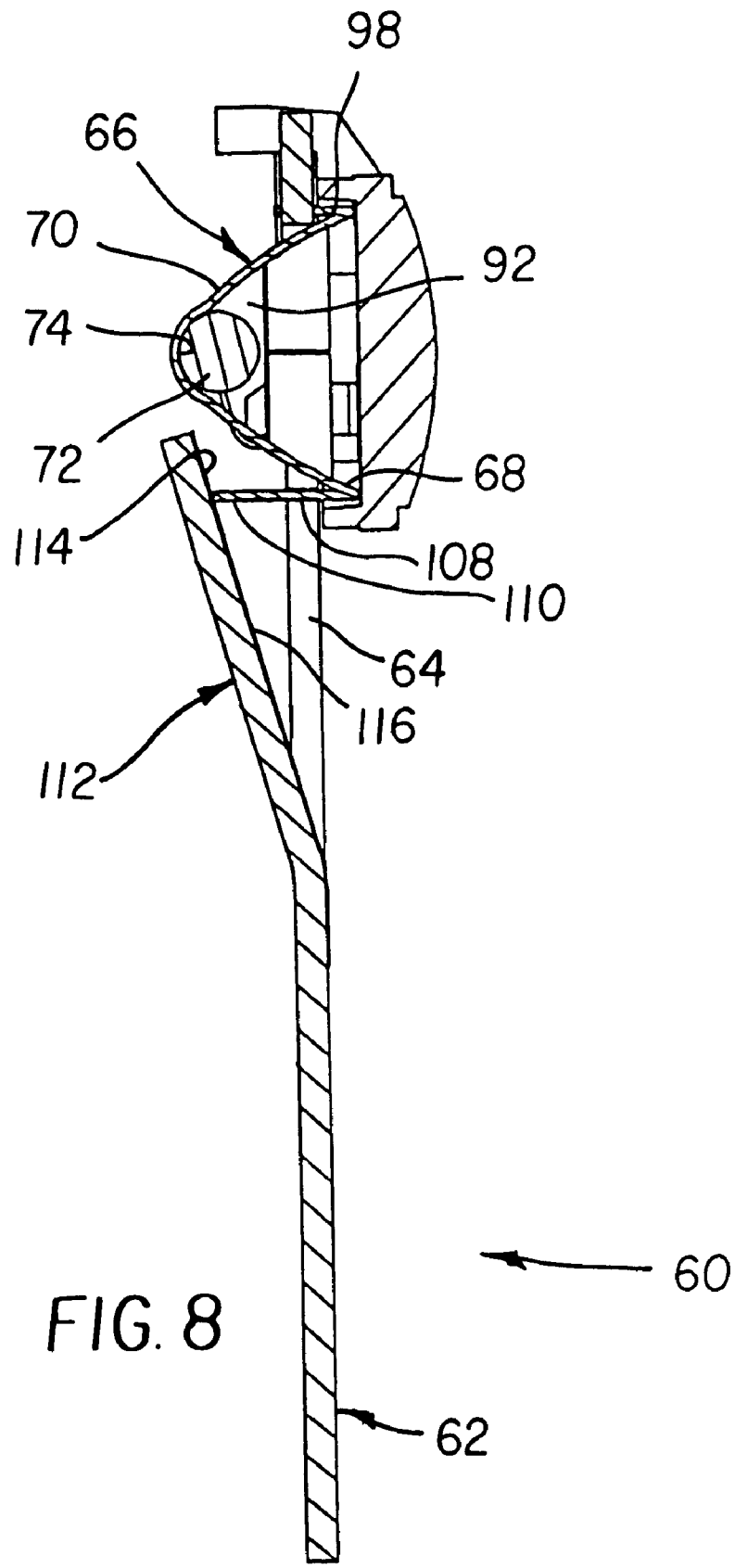
FIG. 8 is an elevation cross-section view of the electronic flash apparatus shown in FIG. 5.

The flash reflector 66 has a flexible flat wall portion 98 with two identical corner projections 100 and 102 that are snugly received in corresponding openings 104 and 106 in the flash circuit board 62 to affix the wall portion directly to the flash circuit board, and it has another flat wall portion 108 with a free tab 110, shown in FIGS. 7 and 8, which is located in the hole 64 in the flash circuit board 62 to avoid affixing the wall portion to the flash circuit board.

The flash circuit board 62 has a resilient integral portion preferably in the form of a cantilevered beam 112 that longitudinally extends at an acute angle to the hole 64 in the flash circuit board. A free end 114 of the cantilevered beam 48 inherently presses against the free tab 110 of the flash reflector 66 to continuously urge the inner side 74 of the rear closed end 70 against the flash tube 72 and to simultaneously urge the front open end 68 of the flash reflector against the flash cover-lens 76.

A flexible triggering electrode 116 is solder-connected to the flash circuit board 62 and is supported on the cantilevered beam 112 of the flash circuit board 62, for the cantilevered beam to hold the triggering electrode against an outer side 118 of the rear closed end 70 of the flash reflector 66.

Urging the inner side 74 of the rear closed end 70 of the flash reflector 66 against the flash tube 72, together with urging the triggering electrode 116 against the outer side 118 of the rear closed end 70 of the flash reflector, enables the flash tube to be fired. Urging the front open end 68 of the flash reflector 66 against the flash cover-lens 76 properly seats the flash reflector relative to the flash cover-lens.

The invention has been described with reference to preferred and alternate embodiments. However, it will be appreciated that variations and modifications can be effected by a person of ordinary skill in the art without departing from the scope of the invention.

Parts List 10. electronic flash unit
12. flash circuit board
14. hole
16. flash reflector
18. front open end
20. rear closed end
22. flash tube
24. inner side
26. flash cover-lens
28. posts
30. openings
32. anode main electrode
34. cathode main electrode
36. opposite end
38. opposite end
40. side opening
42. side opening
44. band
46. band
48. cantilevered beam
50. free end
52. outer side
54. triggering electrode
60. electronic flash unit
62. flash circuit board
64. hole
66. flash reflector
68. front open end
70. rear closed end
72. flash tube
74. inner side
76. flash cover-lens
78. posts
80. openings
82. anode main electrode
84. cathode main electrode
86. opposite end
88. opposite end
90. side opening
92. side opening
94. band
96. band
98. flat wall portion
100. corner projection
102. corner projection
104. opening
106. opening
108. flat wall portion
110. tab
112. cantilevered beam
114. free end
116. triggering electrode

What is claimed is:

1. An electronic flash apparatus comprising a flash circuit board, a flash reflector having a front open end, and a flash cover-lens positioned over said front open end of said flash reflector, is characterized in that:

said flash cover-lens is affixed directly to said flash circuit board; and said flash circuit board has a resilient integral portion that presses against said flash reflector to urge said front open end of the flash reflector against said flash cover-lens and properly seat the flash reflector relative to the flash cover-lens.

2. An electronic flash apparatus as recited in claim 1, wherein said flash reflector has a rear closed end opposite said front open end of the flash reflector, and said resilient integral portion of said flash circuit board presses against an outer side of said rear closed end of said flash reflector to urge said front open end of the flash reflector against said flash cover-lens.

3. An electronic flash apparatus as recited in claim 1, wherein said resilient integral portion of said flash circuit board is a cantilevered beam having a free end that presses against said flash reflector to urge said front open end of the flash reflector against said flash cover-lens.

4. An electronic flash apparatus as recited in claim 3, wherein said flash circuit board has a hole, said flash reflector is positioned in said hole, and said free end of said cantilevered beam extends over said hole to press against said flash reflector.

5. An electronic flash apparatus as recited in claim 1, wherein said flash reflector has a rear closed end opposite said front open end of the flash reflector and has a plurality of rear projections spaced from said rear closed end and at least one though not all of which are affixed directly to said flash circuit board, and said resilient integral portion of said flash circuit board presses against at least one of said rear projections that is not affixed to said flash circuit board to urge said front open end of the flash reflector against said flash cover-lens.

6. An electronic flash apparatus comprising a flash circuit board, a flash reflector having a rear closed end, and a flash tube positioned within said flash reflector against an inner side of said rear closed end of the flash reflector, is characterized in that:

said flash circuit board has a resilient cantilevered portion that is biased towards said flash reflector; and a flexible triggering electrode is located on said resilient cantilevered portion of said flash circuit board for the resilient cantilevered portion to urge said triggering electrode against said flash reflector and enable said flash tube to be fired.

7. An electronic flash apparatus as recited in claim 6, wherein said resilient cantilevered portion of said flash circuit board presses said triggering electrode against an outer side of said rear closed end of said flash reflector.

8. An electronic flash apparatus as recited in claim 6, wherein said flash circuit board has a hole, said flash reflector is positioned in said hole, and said resilient cantilevered portion has a free end that extends over said hole to press said triggering electrode against said flash reflector.

9. An electronic flash apparatus as recited in claim 6, wherein said flash reflector has a plurality of rear projections spaced from said rear closed end of the flash reflector and at least one though not all of which are affixed directly to said flash circuit board, and said resilient cantilevered portion of said flash circuit board presses said triggering electrode against at least one of said rear projections that is not affixed to said flash circuit board.

10. An electronic flash apparatus comprising a flash circuit board, a flash reflector having a rear closed end, and a flash tube positioned within said flash reflector against an inner side of said rear closed end of the flash reflector, is characterized in that:

said flash tube is connected to said flash circuit board; and said flash circuit board has a resilient cantilevered portion that presses against said flash reflector to urge said inner side of the rear closed end of said flash reflector towards said flash tube.

11. An electronic flash apparatus as recited in claim 10, wherein said flash reflector has a plurality of rear projections spaced from said rear closed end of the flash reflector and at least one though not all of which are affixed directly to said flash circuit board, and said resilient cantilevered portion of said flash circuit board presses against at least one of said rear projections that is not affixed to said flash circuit board to urge said inner side of the rear closed end of said flash reflector towards said flash tube.

12. An electronic flash apparatus comprising a flash circuit board having a hole, a flash reflector located in said hole in said flash circuit board and having a front open end and a rear closed end, a flash tube positioned within said flash reflector against an inner side of said rear closed end of the flash reflector, and a flash cover-lens positioned over said front open end of said flash reflector, is characterized in that:

said flash cover-lens is affixed directly to said flash circuit board;

said flash tube is resiliently connected to said flash circuit board;

said flash circuit board has a resilient cantilevered portion that extends over said hole in the flash circuit board and presses against an outer side of said rear closed end of said flash reflector to urge said inner side of the rear closed end towards said flash tube and to urge said front open end of the flash reflector against said flash cover-lens; and a flexible triggering electrode is located on said resilient cantilevered portion of said flash circuit board for the resilient cantilevered portion to hold said triggering electrode against said outer side of said rear closed end of said flash reflector.

13. An electronic flash apparatus comprising a flash circuit board having a hole, a flash reflector located in said hole in said flash circuit board and having a front open end and a rear closed end, a flash tube positioned within said flash reflector against an inner side of said rear closed end of the flash reflector, and a flash cover-lens positioned over said front open end of said flash reflector, is characterized in that:

said flash cover-lens is affixed directly to said flash circuit board;

said flash tube is resiliently connected to said flash circuit board;

said flash reflector has a plurality of rear projections spaced from said rear closed end of the flash reflector and at least one though not all of which are affixed directly to said flash circuit board;

said flash circuit board has a resilient cantilevered portion that extends over said hole in the flash circuit board and presses against at least one of said rear projections of said flash reflector that is not affixed to said flash circuit board to urge said inner side of the rear closed end of said flash reflector towards said flash tube and to urge said front open end of the flash reflector against said flash cover-lens; and a flexible triggering electrode is located on said resilient cantilevered portion of said flash circuit board for the resilient cantilevered portion to hold said triggering electrode against at least one of said rear projections of said flash reflector that is not affixed to said flash circuit board.

\* \* \* \* \*